(12) United States Patent
Cheng et al.

(10) Patent No.: US 9,275,854 B2
(45) Date of Patent: Mar. 1, 2016

(54) COMPOUND SEMICONDUCTOR INTEGRATED CIRCUIT AND METHOD TO FABRICATE SAME

(71) Applicant: GLOBALFOUNDRIES U.S. 2 LLC, Hopewell Junction, NJ (US)

(72) Inventors: Kangguo Cheng, Schenectady, NY (US); Bruce B Doris, Slingerlands, NY (US); Pouya Hashemi, White Plains, NY (US); Ali Khakifirooz, Mountain View, CA (US); Alexander Reznicek, Troy, MI (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 13/960,987

(22) Filed: Aug. 7, 2013

(65) Prior Publication Data

US 2015/0044859 A1    Feb. 12, 2015

(51) Int. Cl.
*H01L 21/02*    (2006.01)
*H01L 27/088*   (2006.01)
(Continued)

(52) U.S. Cl.
CPC .... *H01L 21/02387* (2013.01); *H01L 21/02538* (2013.01); *H01L 21/8252* (2013.01); *H01L 27/0605* (2013.01); *H01L 27/088* (2013.01);
(Continued)

(58) Field of Classification Search
CPC ............... H01L 29/66431; H01L 29/2003; H01L 29/452; H01L 29/735; H01L 21/02458; H01L 21/0254; H01L 21/02521; H01L 21/02546; H01L 21/02538; H01L 21/02387; H01L 21/2056; H01L 29/66446; H01L 29/66462; H01L 29/772

USPC .......................................................... 438/478
See application file for complete search history.

(56) References Cited

U.S. PATENT DOCUMENTS 3,925,121 A * 12/1975 Touchy ......................... 438/554
4,777,517 A   10/1988 Onodera et al.
(Continued)

FOREIGN PATENT DOCUMENTS

JP        02109360        4/1990

OTHER PUBLICATIONS

Reddy et al., "InGaAs/GaAs HEMT for High Frequency Application", International Journal of Soft Computing and Engineering (IJSCE), ISSN: 2231-2307, vol. 3, Issue 1, Mar. 2013.
(Continued)

*Primary Examiner* — Julia Slutsker
*Assistant Examiner* — Natalia Gondarenko
(74) *Attorney, Agent, or Firm* — Gibb & Riley, LLC

(57) ABSTRACT

A structure includes a substrate having a surface and a first transistor disposed in a first region supported by the surface of the substrate. The first transistor has a channel formed in a first compound (Group III-V) semiconductor having a first energy bandgap. The structure further includes a second transistor disposed in a second region supported by the substrate. The second transistor has a channel formed in a second compound (Group III-V) semiconductor having a second energy bandgap that is larger than the first energy bandgap. In one embodiment the first compound semiconductor is a layer that overlies a first portion of the surface of the substrate and the substrate is the second compound semiconductor. In another embodiment the second compound semiconductor is provided as a second layer that overlies a second portion of the surface of the substrate. Methods to form the structure are also disclosed.

18 Claims, 3 Drawing Sheets

(51) Int. Cl.
*H01L 21/8252* (2006.01)
*H01L 27/06* (2006.01)
*H01L 29/201* (2006.01)

(52) U.S. Cl.
CPC .......... *H01L 27/0886* (2013.01); *H01L 29/201* (2013.01)

(56) References Cited

U.S. PATENT DOCUMENTS

| | | | |
|---|---|---|---|
| 5,479,033 A * | 12/1995 | Baca et al. | 257/192 |
| 7,276,723 B2 | 10/2007 | Fathimulla et al. | |
| 2002/0185655 A1 | 12/2002 | Fahimulla et al. | |
| 2005/0285098 A1 | 12/2005 | Fathimulla | |
| 2006/0186484 A1 * | 8/2006 | Chau et al. | 257/401 |
| 2006/0220124 A1 | 10/2006 | Ohtake | |
| 2007/0069302 A1 * | 3/2007 | Jin et al. | 257/369 |
| 2007/0267693 A1 * | 11/2007 | Chien et al. | 257/343 |
| 2010/0109044 A1 * | 5/2010 | Tekleab et al. | 257/190 |
| 2011/0049568 A1 * | 3/2011 | Lochtefeld et al. | 257/190 |
| 2011/0233689 A1 * | 9/2011 | Hata et al. | 257/411 |
| 2014/0151807 A1 * | 6/2014 | Chi et al. | 257/348 |

OTHER PUBLICATIONS

U.S. Patent Office Communication U.S. Appl. No. 14/011,797 Dated Oct. 7, 2014, pp. 1-12.
U.S. Patent Office Communication U.S. Appl. No. 114/011,797 Dated Apr. 23, 2015, pp. 1-13.
U.S. Patent Office Communication U.S. Appl. No. 14/011,797 Dated Aug. 5, 2015, pp. 1-3.
U.S. Patent Office Communication U.S. Appl. No. 14/011,797 Dated Sep. 25, 2015, pp. 1-13.

* cited by examiner

COMPOUND SEMICONDUCTOR INTEGRATED CIRCUIT AND METHOD TO FABRICATE SAME

TECHNICAL FIELD

The exemplary embodiments of this invention relate generally to semiconductor devices and fabrication techniques and, more specifically, relate to semiconductor transistor devices such as field effect transistors (FETs) fabricated using compound semiconductor material such as Group III-V materials. The semiconductor devices can be used in, for example, random access memory (RAM), logic circuitry and input/output (I/O) circuitry.

BACKGROUND

In a semiconductor the energy bandgap or simply bandgap generally refers to the energy difference (in electron volts (eV)) between the top of the valence band and the bottom of the conduction band. In conventional integrated circuits with compound semiconductor channels, e.g. Group III-V semiconductor channels, a small bandgap is typically preferred in order to provide higher electron and hole mobility and to allow for the formation of a quantum well. However, a typical integrated circuit also requires the presence of at least some lower current leakage transistors (i.e., lower than the typical current leakage found in the high electron or hole mobility transistor devices) as well as transistors having a higher breakdown voltage than that typically associated with small bandgap devices. The low current leakage transistors can be used in, for example, memory circuits, while the higher breakdown voltage transistors can be used in devices such as I/O FETs. A problem is presented in that the small bandgap semiconductor devices are not preferred for such uses as they typically exhibit high transistor leakage current and also exhibit a low breakdown voltage.

SUMMARY

In a first aspect thereof the embodiments of this invention provide a structure that comprises a substrate having a surface; a first transistor disposed in a first region supported by the surface of the substrate, the first transistor having a channel formed in a first compound semiconductor material having a first energy bandgap; and a second transistor disposed in a second region supported by the substrate, the second transistor having a channel formed in a second compound semiconductor material having a second energy bandgap that is larger than the first energy bandgap.

In another aspect thereof the embodiments of this invention provide a method that is performed during fabrication of an integrated circuit. The method comprises providing a substrate comprised of a first compound semiconductor material having a first bandgap energy; forming a layer on a portion of a surface of the substrate, the layer comprised of a second compound semiconductor material having a second bandgap energy that is smaller than the first bandgap energy; and forming a first transistor having a channel comprised of the first compound semiconductor material and a second transistor having a channel comprised of the second compound semiconductor material.

In a further aspect thereof the embodiments of this invention provide a method that is performed during fabrication of an integrated circuit. This method comprises providing a substrate; depositing a first layer on a first portion of a surface of the substrate, the first layer comprised of a first compound semiconductor material having a first bandgap energy; depositing a second layer on a second portion of the surface of the substrate, the second layer comprised of a second compound semiconductor material having a second bandgap energy that is smaller than the first bandgap energy; and forming a first transistor in the first layer having a channel comprised of the first compound semiconductor material and forming a second transistor in the second layer having a channel comprised of the second compound semiconductor material.

DETAILED DESCRIPTION

The various examples of the embodiments of this invention provide an integrated circuit in which high performance devices, such as those needed for high speed logic circuitry, are formed from small bandgap compound semiconductor material whereas low current leakage and/or higher breakdown voltage devices are formed from larger bandgap semiconductor material, where the small bandgap semiconductor material and the larger bandgap semiconductor material share a common substrate. In one exemplary embodiment the larger bandgap semiconductor material can be a layer that is present beneath a layer of small bandgap semiconductor material and can function as a substrate for the small bandgap semiconductor material layer. In another exemplary embodiment a common substrate can support in one region thereof a layer of the small bandgap semiconductor material and in another separate region thereof a layer of the larger bandgap semiconductor material.

For the purposes of describing this invention a small (or narrow or low) bandgap semiconductor material can be characterized as having a bandgap equal to or less than about 0.75 eV (electron volts), while a large (or wide or high) bandgap semiconductor material can be characterized as having a bandgap greater than about 0.75 eV, such as a bandgap of about 1 eV or greater. The small bandgap semiconductor material can be one comprised of a tertiary Group III-V material such as, listing just several non-limiting examples, $In_xGa_{1-x}As$ and $In_xGa_{1-x}Sb$, where varying the value of x sets the mole fraction of the constituents and thus the value of the bandgap. In some embodiments the small bandgap semiconductor material can be one comprised of a quaternary Group III-V material such as, again merely by example, $In_xGa_{1-x}As_ySb_{1-y}$, where varying the value of x and y sets the mole fractions and the bandgap. For example, high electron and hole mobility can be obtained in InSb, InAs, GaSb, and $In_{0.53}Ga_{0.47}As$, but these materials all have bandgaps ranging from 0.17 eV in InSb to 0.75 eV in $In_{0.53}Ga_{0.47}As$. The large bandgap semiconductor material could be one comprised of a binary Group III-V material, for example, GaAs (typical bandgap value 1.43 eV) or InP (typical bandgap value 1.34 eV). The various embodiments of this invention should not be construed as being limited to any particular type or types of compound semiconductor material. It should be further noted that different semiconductors may be used as high mobility small bandgap material in the NFET and PFET regions to achieve highest electron and hole mobility, respectively, or to form the desired quantum well.

Reference is made to FIG. 1 for illustrating process steps in accordance with a first embodiment of this invention.

Figure 1A:
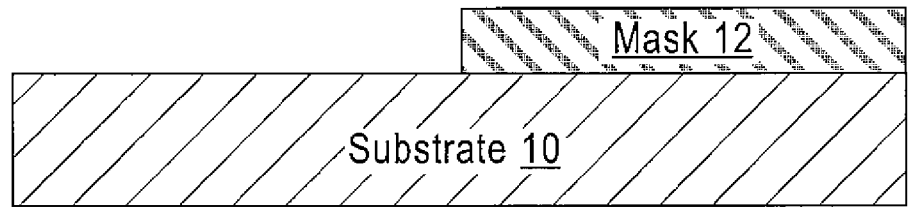
FIGS. 1A-1D, collectively referred to as FIG. 1, illustrate steps in a process in accordance with a first embodiment of this invention to fabricate both small bandgap and large bandgap compound semiconductor transistors on a common wafer substrate.

In FIG. 1A a large bandgap substrate 10 is provided, such as one comprised of InP or GaAs having a bandgap greater than, for example, about 1 eV. On a top surface a mask 12 is applied over a portion of the substrate where large bandgap, low leakage transistor devices will be formed, such as those used in memory circuitry, and/or those that require a higher breakdown voltage, such as those used in I/O devices.

Figure 1B:
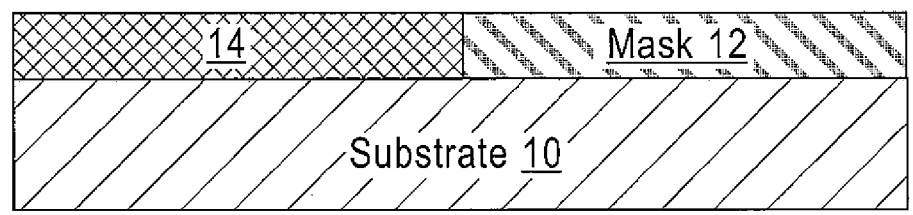

FIG. 1B shows a result of an epitaxial deposition of a layer 14 of small bandgap semiconductor material on the unmasked portion of the substrate 10 and the subsequent removal of the mask 12. The epitaxial deposition can be accomplished by any conventional process such as, for example, molecular beam epitaxy (MBE) or metal organic vapor phase epitaxy (MOVPE). The layer 14 can be comprised of, for example, $In_xGa_{1-x}As$ where x is equal to about 0.5. For an embodiment where the small bandgap semiconductor material will be processed to form a planar FET or FETs the layer can have an exemplary thickness of about 10 nm or less. For an embodiment where the small bandgap semiconductor material will be processed to form a non-planar FET or FETs, such as a FinFET (e.g., see FIG. 3), the layer can have an exemplary thickness in a range of about 20 nm to about 40 nm.

Figure 1C:
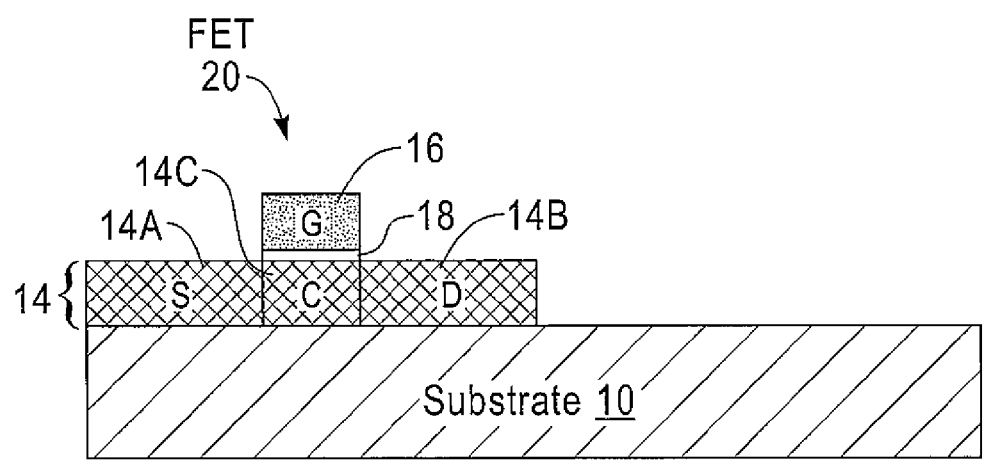

FIG. 1C shows result of the processing of the layer 14 of small bandgap semiconductor material to form a planar FET having a source (S) 14A, a drain (D) 14B and a gate structure or stack (G) 16. Underlying the gate 16 is the transistor channel (C) 14C formed in the layer 14 of small bandgap semiconductor material. The source and drain 14A, 14B can be formed by implanting and/or diffusing any conventional suitable dopants (e.g., Si, Te, Be, Zn, or C) into layer 14 of small bandgap semiconductor material depending on whether a P-type FET or an N-type FET is being fabricated.

In the embodiment where a FinFET transistor is being fabricated (e.g., see FIG. 3) a Fin or Fins can be formed by selectively masking the layer 14 and removing, such as by a reactive ion etch (RIE) process, unmasked portion of the layer 14 to fabricate a Fin having a width (W) of, for example, about 5 nm to about 15 nm, and a height (H) equal to the thickness of the layer 14, e.g., about 20 nm to about 40 nm. Fin formation is followed by masking and formation of the gate 16 around the Fin where the channel 14C will exist.

In either the planar or the FinFET embodiments the gate 16 can be comprised of, for example, a metal system selected from one or more of TiN, TiC, TaN, TaC, TaSiN, HfN, W, Al and Ru. There can be a layer of gate dielectric 18 between the gate 16 and the layer 14 of small bandgap semiconductor material, such as a layer of oxide or a layer of larger bandgap semiconductor material such as AlGaAs, AlInAs or other suitable semiconductors. The layer of gate dielectric could also be layer comprised of a high dielectric constant (high-k) material formed by methods known in the art including, for example, chemical vapor deposition (CVD), atomic layer deposition (ALD), molecular beam deposition (MBD), pulsed laser deposition (PLD), liquid source misted chemical deposition (LSMCD), etc. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from about 0.5 to 3 and each value of y is independently from about 0 to 2. The thickness of the high-k dielectric layer 18 may be from 1 nm to 10 nm, and more preferably from about 1.5 nm to about 3 nm. The gate metal 16 can be deposited directly on the top surface of the high-k dielectric layer 18 by, for example, chemical vapor deposition (CVD), physical vapor deposition (PVD), or by atomic layer deposition (ALD).

In some embodiments the interface between the metal of the gate 16 and the layer 14 of small bandgap semiconductor material can be a direct Schottky interface.

Figure 1D:
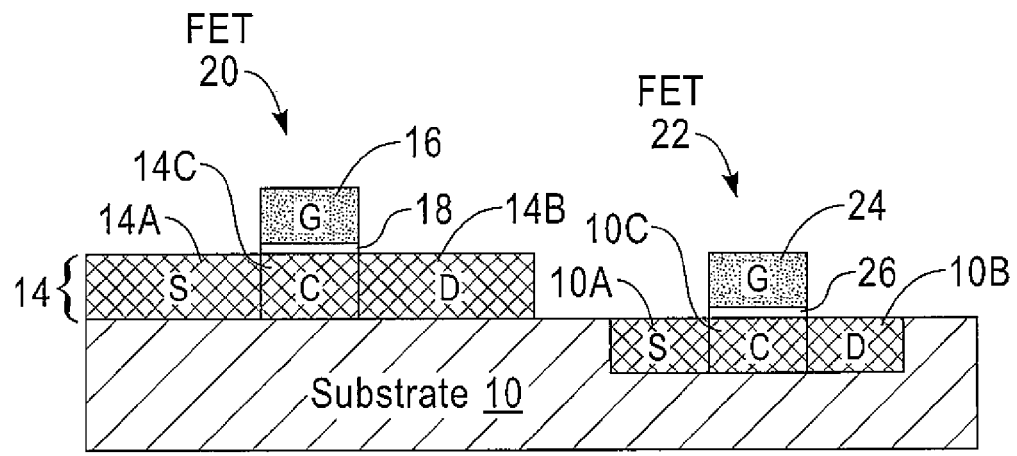

FIG. 1D illustrates a result of the fabrication of a second FET 22 in the larger bandgap semiconductor material of the substrate 10. The second FET 22 in this embodiment is also a planar-type FET. The second FET is fabricated by forming in the wide bandgap material of the substrate 10 a source 10A and a drain 10B on opposing sides of a gate 24 that is disposed above a channel 10C formed in the wide bandgap semiconductor material of substrate 10. The source and drain 10A, 10B can be formed by implanting and/or diffusing any conventional suitable dopants (e.g., Si, Te, Be, Zn, or C) into layer 14 of small bandgap semiconductor material depending on whether a planar P-type FET or an N-type FET is being fabricated. The gate 24 can be comprised of a metal system as was described above for the FET 20, and can be located upon a gate dielectric layer 26 that can be comprised of any of the various materials noted above for the FET 20. In some embodiments the interface between the gate 24 and the substrate 10 comprised of the large bandgap semiconductor material can be a direct Schottky interface.

The end result is the formation of at least one FET 20 in the small bandgap semiconductor material 14, where the FET 20 can be used in, for example, low power, high performance logic circuitry where high electron or hole mobility is desired, and the formation upon the same common substrate 10 of at least one FET 22 in the large bandgap semiconductor material of the substrate 10. The FET 22 can be used in, for example, low power and low current leakage (e.g., memory) circuitry or high voltage (e.g., I/O) circuitry.

Reference is now made to FIG. 2 for illustrating process steps in accordance with a second embodiment of this invention.

Figure 2A:
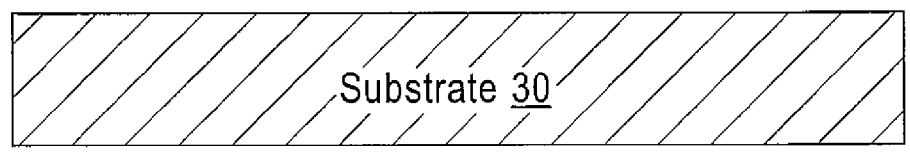
FIGS. 2A-2C, collectively referred to as FIG. 2, illustrate steps in a process in accordance with a second embodiment of this invention to fabricate both small bandgap and large bandgap compound semiconductor transistors on a common wafer substrate.
Figure 2B:
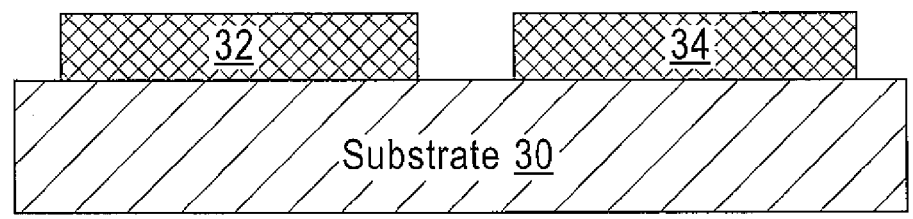

In FIG. 2A a substrate 30 is provided. The substrate 30 can be comprised of a large bandgap material such as one comprised of InP or GaAs having a bandgap greater than, for example, about 1 eV. More generally the substrate 30 can be any type of substrate upon which, as is shown in FIG. 2B, a layer of small bandgap semiconductor material 32 and a layer of large bandgap semiconductor material 34 can be epitaxially formed directly on the substrate 30 or formed via the use of one or more lattice accommodation or matching layers between the epitaxially deposited Group III-V material and the substrate 30.

The epitaxial deposition of the layers 32 and 34 can be accomplished by any conventional process such as, for example, molecular beam epitaxy (MBE) or metal organic vapor phase epitaxy (MOVPE). The layer 32 can be comprised of, for example, $In_xGa_{1-x}As$ where x is equal to about 0.5 while the layer 34 can be comprised of, for example, GaAs or InP. The thickness of the layer 32 can be as described above with respect to the planar or FinFET embodiments of FIG. 1 while the thickness of the layer 34 can be the same or comparable. The layers 32 and 34 can be deposited in any order.

Figure 2C:
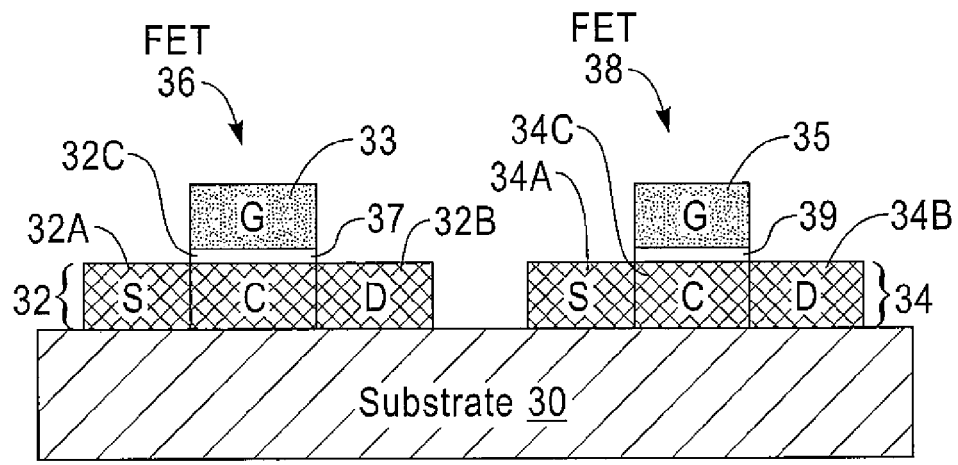

FIG. 2C shows the result of the processing of layers 32 and 34 to form a first FET 36 in the layer of small bandgap semiconductor material 32 and a second FET 38 in the layer of large bandgap semiconductor material 34. The processing of the layer 32 of small bandgap semiconductor material forms a transistor source (S) 32A and drain (D) 32B and also forms a transistor gate (G) 33. Underlying the gate 33 is the transistor channel (C) 32C that exists in the layer of small bandgap semiconductor material 32. As in the embodiment of FIG. 1 the source and drain 32A, 32B can be formed by implanting and/or diffusing any conventional suitable dopants (e.g., Si, Te, Be, Zn, or C) into the layer 32 of small bandgap semiconductor material depending on whether a P-type FET or an N-type FET is being fabricated.

The processing of the layer 34 of large bandgap semiconductor material forms a transistor source (S) 34A and drain (D) 34B and also forms a transistor gate (G) 35. Underlying the gate 35 is the transistor channel (C) 34C contained in the layer of small bandgap semiconductor material 32. The source and drain 34A, 34B can be formed by implanting and/or diffusing any conventional suitable dopants into the layer 34 of large bandgap semiconductor material depending on whether a planar P-type FET or an N-type FET is being fabricated.

As in the embodiment of FIG. 1, when a FinFET transistor is being fabricated a Fin or Fins can be formed by selectively masking the layer 32 and/or the layer 34 and removing unmasked portions of the layers 32 and/or 34 to fabricate Fins having widths of, for example, about 5 nm to about 15 nm, and a height equal to the thickness of the layer 14, e.g., about 20 nm to about 40 nm. Fin formation is followed by formation of the gate 33 and/or 35 around the Fin where the channel 32C or 34C will exist. Note that one of the transistors 36, 38 could be a planar FET and the other a FinFET, or both transistors 36, 38 could be planar FETs, or both transistors 36, 38 could be FinFETS.

In either the planar or the FinFET embodiments for either of the transistors 36 and 38 the gates 33 and 35 can be comprised of, for example, a metal system selected from one or more of TiN, TiC, TaN, TaC, TaSiN, HfN, W, Al and Ru, and any associated gate dielectrics 37 and 39 can be as described above for the embodiment of FIG. 1. In some embodiments the interface between the gate metal 33 and/or 35 and the underlying layer of semiconductor material 32, 34 can be a direct Schottky interface.

The end result is the formation of at least one FET 36 in the small bandgap semiconductor material layer 32, where the FET 36 can be used in, for example, low power, high performance logic circuitry, and the formation upon the same common substrate 30 of at least one FET 38 in the large bandgap semiconductor material layer 34. The FET 38 can be used in, for example, low power (e.g., memory) or high voltage (e.g., I/O) circuitry.

Figure 3A:
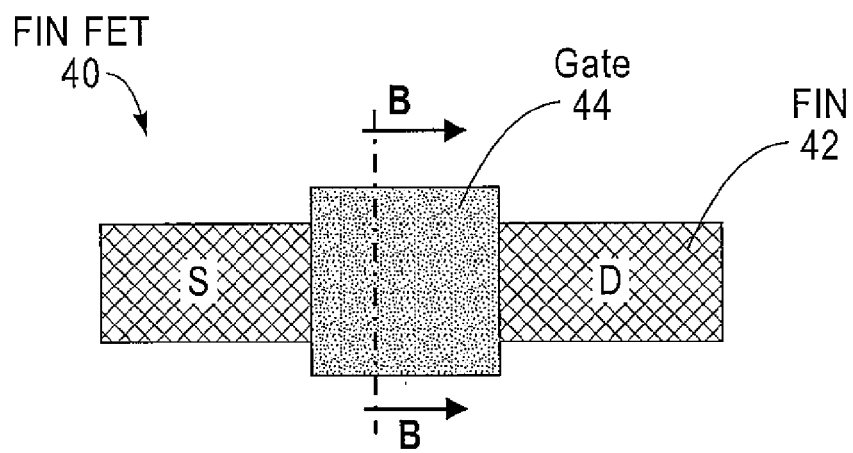
FIGS. 3A and 3B, collectively referred to as FIG. 3, show an enlarged top view of a FinFET (FIG. 3A) an enlarged cross-sectional end view (FIG. 3B) of the FinFET taken along the section line B-B of FIG. 3A.
Figure 3B:
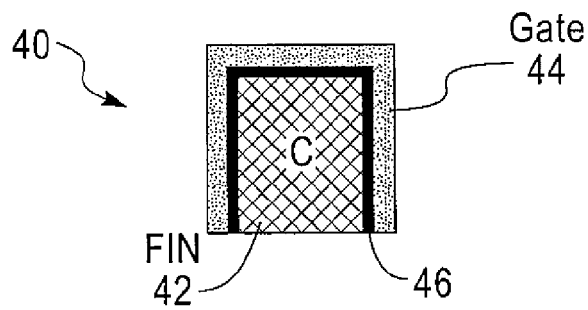

By way of reference FIG. 3 shows an enlarged top view of a FinFET 40 in FIG. 3A and in FIG. 3B shows an enlarged cross-sectional end view of the FinFET 40 taken along the section line B-B of FIG. 3A. The FinFET 40 can be conventional in construction and generally includes a Fin 42 that extends upwards from a surface and a gate structure 44 that surrounds at least three sides of the Fin 42. One end of the Fin 42 is doped to form the Source (S) of the FinFET, the opposite end of the Fin 42 is doped to form the Drain (D) of the FinFET, and that portion of the Fin 42 disposed beneath the gate structure 44 forms the Channel (C) of the FinFet. The gate dielectric 46 is disposed between the gate structure 44 and the underlying surface of the Fin 42. In the completed device there can be, for example, a passivation layer (not shown) applied over the FinFET 40 and electrical contacts (not shown) made to the S, D, and the gate structure 44. The FinFET 40 shown in FIG. 3 represents one non-limiting example of transistor device where the channel is formed in the small bandgap compound semiconductor material of the layer 14 or the layer 32, or is formed in the large bandgap compound semiconductor of the substrate 10 or the layer 34.

It is to be understood that the exemplary embodiments discussed above with reference to FIGS. 1 and 2 can be used on common variants of the FET device including, e.g., FET devices with multi-fingered FIN and/or gate structures and FET devices of varying gate width and length.

Integrated circuit dies can be fabricated with various devices such as FETs and can also include, for example, bipolar transistors, metal-oxide-semiconductor transistors, diodes, resistors, capacitors, inductors, etc. These various devices are formed upon the common substrate using methods as described herein. An integrated circuit in accordance with the present invention can be employed in applications, hardware, and/or electronic systems. Suitable hardware and systems in which such integrated circuits can be incorporated include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the faun disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent semiconductor fabrication processes, including deposition processes, etching processes may be used by those skilled in the art. Further, the exemplary embodiments are not intended to be limited to only those materials, metals , insulators, dopants, dopant concentrations, layer thicknesses and the like that were specifically disclosed above. Any and all such and similar modifications of the teachings of this invention will still fall within the scope of this invention.

What is claimed is:

1. A method performed during fabrication of an integrated circuit, comprising:
   providing a compound semiconductor substrate comprising a compound semiconductor material comprising a Group III-V compound semiconductor material having a large bandgap energy, the large bandgap energy being greater than about 1 eV, the compound semiconductor substrate having a top surface, and the top surface having a first portion and a second portion positioned laterally adjacent to and level with the first portion;
   forming a compound semiconductor layer immediately adjacent to the second portion of the top surface of the compound semiconductor substrate, the compound semiconductor layer comprising an additional compound semiconductor material having a small bandgap energy, the small bandgap energy being smaller than the large bandgap energy; and
   forming a first transistor and a second transistor,
      the first transistor being formed so as to have a first channel positioned laterally between first source and drain regions and a first gate on the first channel, the first channel and the first source and drain regions being entirely within the compound semiconductor substrate immediately below the first portion of the top surface, and
      the second transistor being formed so as to have a second channel positioned laterally between second source and drain regions and a second gate on the second channel, the second channel and the second source and drain regions being entirely within the compound semiconductor layer above the second portion of the top surface and the second gate being immediately adjacent to the compound semiconductor layer.

2. The method of claim 1, the additional compound semiconductor material comprising a second Group III-V compound semiconductor material that is different from the Group III-V compound semiconductor material of the compound semiconductor substrate.

3. The method of claim 1, the compound semiconductor material comprising a binary Group III-V compound semiconductor material, and the additional compound semiconductor material comprising a tertiary or a quaternary Group III-V compound semiconductor material.

4. The method of claim 1, the first transistor comprising a planar FET, and the second transistor comprising a FinFET.

5. A method performed during fabrication of an integrated circuit, comprising:
   providing a compound semiconductor substrate comprising a compound semiconductor material comprising a Group III-V compound semiconductor material having a first large bandgap energy, the first large bandgap energy being greater than about 1 eV, the compound semiconductor substrate having a top surface, and the top surface having a first portion and a second portion positioned laterally adjacent to and level with the first portion;
   depositing a first compound semiconductor layer immediately adjacent to the first portion of the top surface of the compound semiconductor substrate, the first compound semiconductor layer comprised of a first additional compound semiconductor material that is different from the compound semiconductor material and has a second large bandgap energy, the second large bandgap energy being greater than about 0.75 eV;
   depositing a second compound semiconductor layer immediately adjacent to the second portion of the top surface of the compound semiconductor substrate, the second compound semiconductor layer being physically separated from the first compound semiconductor layer and comprising a second additional compound semiconductor material having a small bandgap energy, the small bandgap energy being equal to or less than about 0.75 eV; and
   forming a first transistor and a second transistor,
      the first transistor being formed so as to have a first channel positioned laterally between first source and drain regions and a first gate on the first channel, the first channel and the first source and drain regions being entirely within the first compound semiconductor layer immediately adjacent to the first portion of the top surface and the first gate being immediately adjacent to the first compound semiconductor layer,
      the second transistor being formed so as to have a second channel positioned laterally between second source and drain regions and a second gate on the second channel, the second channel and the second source and drain regions being entirely within the second compound semiconductor layer immediately adjacent to the second portion of the top surface and the second gate being immediately adjacent to the second compound semiconductor layer.

6. The method of claim 5, the compound semiconductor material, the first additional compound semiconductor material and the second additional compound semiconductor material comprising different Group III-V compound semiconductor materials.

7. The method of claim 5, the compound semiconductor material and the first additional compound semiconductor material comprising different binary Group III-V compound semiconductor materials, and the second additional compound semiconductor material comprising a tertiary or a quaternary Group III-V compound semiconductor material.

8. The method of claim 5, the first transistor being one of a planar FET or a FinFET, and the second transistor being one of a planar FET or a FinFET.

9. The method of claim 5, the first compound semiconductor layer and the second compound semiconductor layer being epitaxially deposited over the top surface of the compound semiconductor substrate.

10. A method performed during fabrication of an integrated circuit, comprising:
   providing a compound semiconductor substrate comprising a compound semiconductor material comprising a Group III-V compound semiconductor material having a large bandgap energy, the large bandgap energy being greater than about 1 eV, the compound semiconductor substrate having a top surface, and the top surface having a first portion and a second portion positioned laterally adjacent to and level with the first portion;
   forming a mask layer to cover the first portion of the top surface of the compound semiconductor substrate;
   depositing a compound semiconductor layer immediately adjacent to the second portion of the top surface of the compound semiconductor substrate, the compound semiconductor layer comprising an additional compound semiconductor material comprising an additional Group III-V compound semiconductor material having a small bandgap energy, the small bandgap energy being equal to or less than about 0.75 eV;

removing the mask layer from the first portion of the top surface of the compound semiconductor substrate; and forming a first transistor for use in at least one of memory and input/output circuitry and a second transistor for use in logic circuitry, the first transistor being formed so as to have a first channel positioned laterally between first source and drain regions and a first gate adjacent to the first channel, the first channel and the first source and drain regions being entirely within the compound semiconductor substrate immediately below the first portion of the top surface, the second transistor being formed so as to have a second channel positioned laterally between second source and drain regions and a second gate adjacent to the second channel, the second channel and second source and drain regions being entirely within the compound semiconductor layer immediately adjacent to the second portion of the top surface and the second gate being immediately adjacent to the compound semiconductor layer.

11. The method of claim 10, the Group III-V compound semiconductor material comprising a binary Group III-V compound semiconductor material, and the additional Group III-V compound semiconductor material comprising a tertiary or a quaternary Group III-V compound semiconductor material.

12. The method of claim 10, the first transistor being a planar FET and the second transistor being a planar FET.

13. The method of claim 10, the first transistor being a planar FET and the second transistor being a FinFET.

14. The method of claim 10, the first transistor being a FinFet and the second transistor is a planar FET.

15. The method of claim 10, the first transistor being a FinFET and the second transistor being a FinFET.

16. The method of claim 1, the compound semiconductor material comprising InP.

17. The method of claim 5, the compound semiconductor material comprising InP.

18. The method of claim 10, the compound semiconductor mate rial comprising InP.

* * * * *